United States Patent
Hara

(10) Patent No.: US 7,737,436 B2
(45) Date of Patent: Jun. 15, 2010

(54) METHOD FOR MANUFACTURING SEMICONDUCTOR DEVICE, SEMICONDUCTOR DEVICE, AND ELECTROOPTICAL DEVICE

(75) Inventor: Toshihiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 335 days.

(21) Appl. No.: 11/771,346

(22) Filed: Jun. 29, 2007

(65) Prior Publication Data

US 2008/0012012 A1    Jan. 17, 2008

(30) Foreign Application Priority Data

Jul. 14, 2006   (JP) ............................... 2006-194733

(51) Int. Cl.
*H01L 35/24* (2006.01)

(52) U.S. Cl. .......... 257/40; 257/E29.111; 257/E51.001; 438/99

(58) Field of Classification Search ............. 438/22–24, 438/82, 108, 99; 257/40, E51.001, E29.111
See application file for complete search history.

(56) References Cited

U.S. PATENT DOCUMENTS

| | | | |
|---|---|---|---|
| 7,169,652 B2* | 1/2007 | Kimura | 438/149 |
| 2003/0087476 A1* | 5/2003 | Oohata et al. | 438/108 |
| 2004/0126911 A1* | 7/2004 | Kimura | 438/22 |
| 2005/0181533 A1* | 8/2005 | Kawase et al. | 438/82 |
| 2006/0132461 A1* | 6/2006 | Furukawa et al. | 345/173 |

FOREIGN PATENT DOCUMENTS

| | | |
|---|---|---|
| JP | A 2001-166301 | 6/2001 |
| JP | A 2003-518756 | 6/2003 |
| JP | A 2003-297974 | 10/2003 |

* cited by examiner

*Primary Examiner*—David Vu
*Assistant Examiner*—Brandon Fox
(74) *Attorney, Agent, or Firm*—Oliff & Berridge, PLC

(57) ABSTRACT

A method for manufacturing a semiconductor device which is equipped with a switching element having an organic semiconductor layer and a drive circuit electrically coupled to the switching element on a first surface of a flexible substrate, the method including: providing the drive circuit above a temporary substrate in advance, transferring the drive circuit to the first surface of the flexible substrate, and then providing the organic semiconductor layer by a liquid phase process.

5 Claims, 5 Drawing Sheets

METHOD FOR MANUFACTURING SEMICONDUCTOR DEVICE, SEMICONDUCTOR DEVICE, AND ELECTROOPTICAL DEVICE

BACKGROUND

1. Technical Field

Several aspects of the present invention relate to a semiconductor device, a method for manufacturing the same, and an electro optical device.

2. Related Art

In recent years, flexible electronic apparatuses have increasingly attracted attention. A flexible display typified by electronic paper, for example, is not only light to carry with, but also shock absorbing and foldable by hand, and can be the electronic apparatus to help realization of the ubiquitous network society. Proposed in JP-T-2003-518756, for example, is such an electronic apparatus having bendable organic thin film transistors (hereunder abbreviated as organic TFTs) mounted thereon.

Because the transistor elements of the organic TFTs are fabricated at normal temperature and pressure, the production costs can be low. The production costs can even be greatly reduced by using such general printing techniques as an inkjet technique and a spin coating technique.

However, because a field effect transfer rate of an organic TFT is several digits lower than that of a TFT using a silicon thin film, if all the TFTs in an electronic device are organic, the drive capacity of the device is reduced. To solve this problem, the organic TFTs may be used only partially in the device, and other semiconductor elements with higher field effect transfer rates may be used for the drive circuit.

Among them, low-temperature polysilicon thin film transistors (hereunder abbreviated as LTPS-TFTs) are suited to solve the problem. Because of its high field effect transfer rate, the drive capability of the LTPS-TFTs is not reduced even when an area of the electronic device occupied by the LTPS-TFTs is small, and, therefore, the LTPS-TFTs are suitable for reducing the size of the device in weight and thickness. However, a disadvantage is that the LTPS-TFTs need to be manufactured at a temperature as high as 600° C. and are not easily fabricated on a plastic substrate used for a flexible device.

This disadvantage is solved by a mounting technique referred to as surface-free technology by laser ablation/annealing (SUFTLA: a registered trademark of Seiko Epson Corp.), in which the LTPS-TFTFs are fabricated on a glass substrate in advance and then transferred onto a plastic substrate. JP-A-2003-297974 is an example of the related art.

In the manufacture of a semiconductor device having the organic TFTs, however, if the organic TFTs are first fabricated on the flexible substrate, they become readily damaged as they are vulnerable to heat and moisture. More specifically, in the process of SUFTLA for transferring peripheral circuits, the LTPS-TFTs are thermally compressed on the flexible substrate with an adhesive agent. Thus, the high temperature and pressure applied to the transistor elements of the organic TFTs may deteriorate the performance of the transistor elements.

SUMMARY

An advantage of the invention is to provide a method for manufacturing a semiconductor device having a high drive capacity on a flexible substrate.

According to a first aspect of the invention, a method for manufacturing a semiconductor device which is equipped with a switching element having an organic semiconductor layer and a drive circuit electrically coupled to the switching element on a first surface of a flexible substrate, the method includes: providing the drive circuit above a temporary substrate in advance, transferring the drive circuit to the first surface of the flexible substrate, and then providing the organic semiconductor layer by a liquid phase process.

In this method, because the drive circuit is formed above the temporary substrate in advance and then transferred to the flexible substrate, it is possible to readily and successfully provide the drive circuit on the flexible substrate. This has been considered impossible because of the degree of difference in heat resistance and thermal expansion rate between the drive circuit and the flexible substrate.

Moreover, because the organic semiconductor layer is formed after transferring the drive circuit to the flexible substrate, the organic semiconductor layer is not exposed to high temperature and pressure and is thus less likely to deteriorate. Therefore, a semiconductor device having stable characteristics may be provided.

It is preferable that the semiconductor device manufacturing method also include: attaching a support substrate to a second surface of the flexible substrate before transferring the drive circuit to the first surface of the flexible substrate.

This method is desirable because it may reduce the bent and swelling of the flexible substrate in each manufacturing process and may improve alignment precision as well as handling of the substrate. This method is very useful particularly for the alignment during the process of transferring the drive circuit from the temporary substrate to the surface (first surface) of flexible substrate, more particularly for the alignment when dropping an adhesive agent.

It is also preferable that, in the semiconductor device manufacturing method, the liquid phase process be a droplet discharge method.

By the droplet discharge method, it is not only possible to fabricate a high-precision pattern without thermally loading the flexible substrate but also to fabricate the organic semiconductor layer directly and only on a desired part of the substrate. Accordingly, the flexible semiconductor device may be manufactured at low costs through simpler processes as compared with commonly known techniques in which the patterning comes after the film formation on the entire substrate.

According to a second aspect of the invention, a semiconductor device is manufactured by the manufacturing method of the first aspect of the invention. Because the semiconductor device of this aspect includes the flexible substrate on which the switching element having the organic semiconductor layer and the drive circuit with a high field effect transfer rate are mounted, it has excellent flexibility and drive characteristics.

According to a third aspect of the invention, an electro optical device is equipped with the above-described semiconductor device. In this case, the electro optical device may have excellent flexibility and drive characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

A semiconductor device, a method for manufacturing the same, and an electro optical device of the invention will be described with reference to FIGS. 1 through 5.

The embodiments show modes of the invention and do not limit the invention, and any modifications thereto can be made within the scope of the concept of the invention. Also, note that, in the accompanied drawings, the layers and parts are drawn differently so that they are in recognizable sizes.

Semiconductor Device

First, the composition of the semiconductor device will be described with reference to FIGS. 1A and 1B.

Figure 1A:
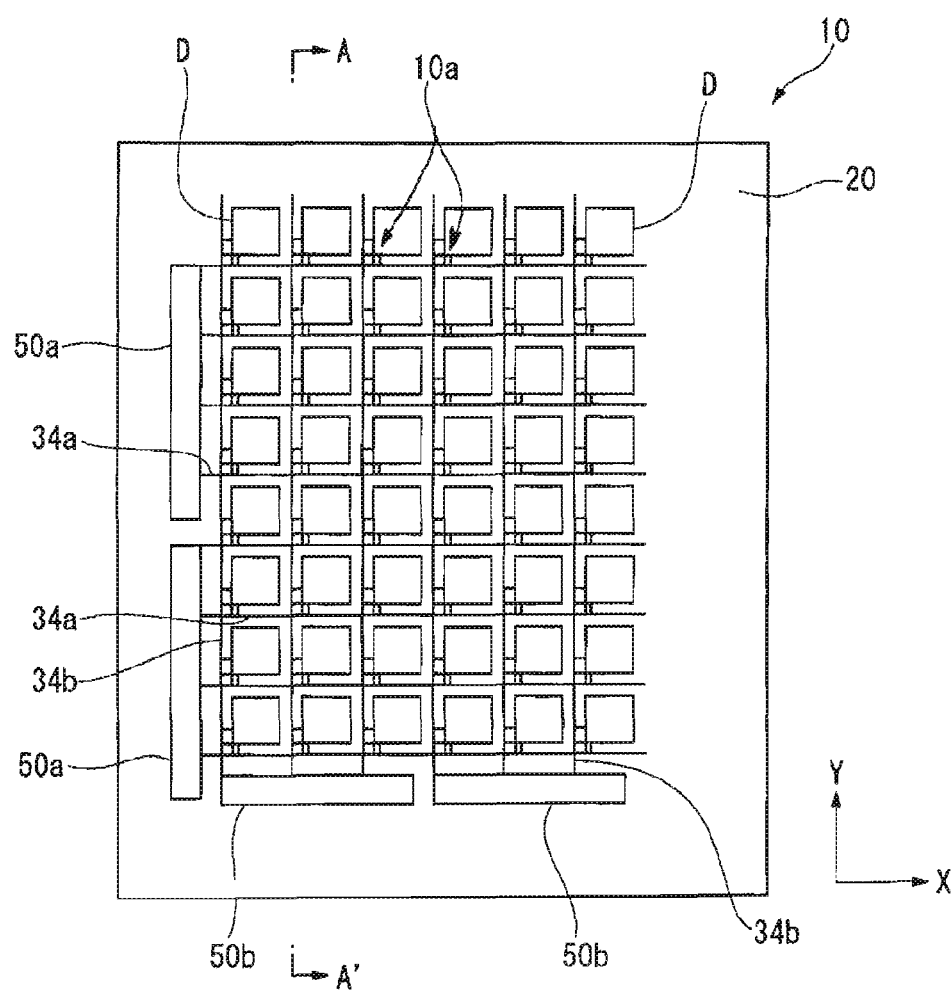
FIG. 1A is a schematic plan view of an example of a semiconductor device obtained by a manufacturing method according to a first embodiment of the invention.
Figure 1B:
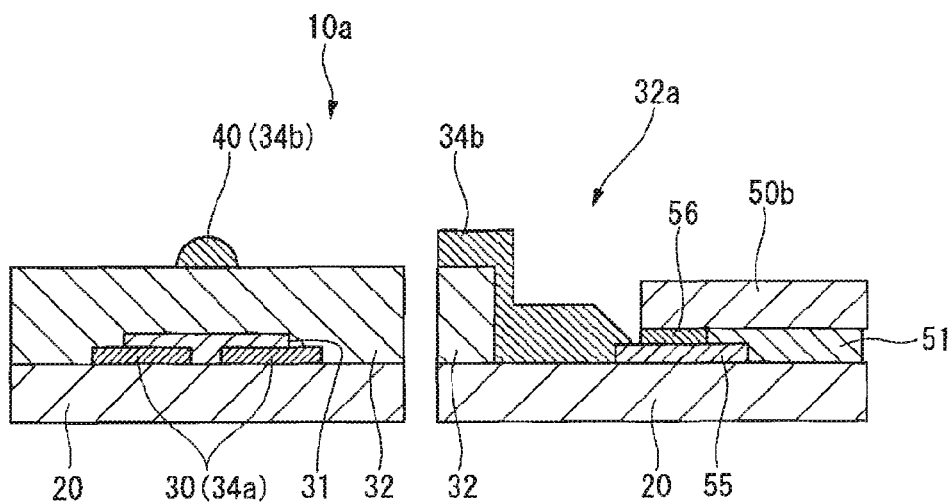
FIG. 1B is a schematic sectional view taken on a line A-A' of the example of the semiconductor device obtained by the manufacturing method according to the first embodiment of the invention.

FIG. 1A is a plan diagram of a semiconductor device obtained by the manufacturing method of one embodiment of the invention, and FIG. 1B is a schematic sectional diagram of an essential part of the semiconductor device taken on a line A-A' of FIG. 1A.

Referring to FIG. 1A, a semiconductor device 10 is an example of an active matrix substrate favorably used for, e.g., an electrophoretic display and includes: a flexible substrate 20, a plurality of pixel electrodes D arranged in matrix in plan view overlying the flexible substrate 20, organic thin film transistors (TFTs) 10a as switching elements each of which corresponding to each of the pixel electrodes D, drive circuits 50a, 50b equipped with low-temperature polysilicon thin film transistors (LTPS-TFTs).

The organic TFTs 10a are electrically coupled to data lines 34a and scanning lines 34b intersecting with each other on the flexible substrate 20. Each data line 34a is coupled to a source of each organic TFT 10a, and each scanning line 34b is coupled to a gate of each organic TFT 10a. An end of each data line 34a extending in an X direction, as shown in the drawing, is electrically coupled to the drive circuit 50a, and two drive circuits 50a are arranged in a Y direction. Also, an end of each scanning line 34b is electrically coupled to the drive circuit 50b, and two drive circuits 50b are arranged in the X directions as shown in FIG. 1A.

The flexible substrate 20 may be made of various types of materials regardless of their transparency and transmittance. In the present embodiment, a plastic substrate is employed for its particularly superb flexibility. Examples of such a plastic substrate (resin substrate) include polyethylene terephthalate (PET), polyethylene naphthalate (PEN), polyethersulfon (PES), polycarbonate (PC), aromatic polyester (liquid crystal polymer), and polyimide (PI). Also, other flexible substrate may apply, such as a glass substrate, a silicon substrate, a metal substrate, a gallium arsenide substrate, and the like.

Each data line 34a is a wiring line extending in the X direction as shown in FIG. 1A and electrically couples each source electrode 30 of the organic TFT 10a and the drive circuit 50a of FIG. 1B. Each scanning line 34b is a wiring line extending in the Y direction as shown in FIG. 1A and electrically couples each gate electrode 40 of the organic TFT 10a and the drive circuit 50b of FIG. 1B. The drive circuit 50a supplies an image signal to the date line 34a of the organic TFT 10a, and the drive circuit 50b supplies a drive signal to the scanning line 34b, thereby actively driving the organic TFT 10a.

The organic TFT 10a shown in FIG. 1B is a switching element formed mainly using a wet film-forming method as will be described hereafter and is a transistor having a so-called top gate structure, in which the source/drain electrodes 30, an organic semiconductor layer 31, an insulating layer 32, and the gate electrode 40 are stacked in this order from the side adjacent the flexible substrate 20. Also, the pixel electrode D (not shown) is provided corresponding to the organic TFT 10a, and the pixel electrode D is electrically coupled to the drain electrode 30 of the organic TFT 10a through a contact hole (not shown).

Additionally, although the structure described in the embodiment is the top gate structure, it may be a bottom gate structure.

The gate electrode 40 of the organic TFT 10a is electrically coupled to the scanning line 34b extending in the Y direction of the flexible substrate 20 either directly or through other wire, and is electrically coupled to a terminal 56 of the drive circuit 50b, with a coupling section 55 therebetween, disposed at the periphery of the flexible substrate 20. In the organic TFT 10a, the insulating layer 32 forms a level difference section 32a at its periphery as shown in FIG. 1B. Accordingly, the scanning line 34b on the insulating layer 32 is provided along this level difference section 32 covering the surface of the insulating layer 32 and reaches the coupling section 55. The coupling section 55 is a metal pad or the like disposed on the flexible substrate 20 and is provided on each wire. The drive circuit 50b is fixed to the flexible substrate 20 with an adhesive agent 51. Also, the terminal 56 of the drive circuit 50b provided on a surface remote from the flexible substrate 20 is adjoined, and electrically coupled, to the coupling section 55 on the flexible substrate 20.

Although not shown in the drawing, the source electrode 30 of the organic TFT 10a is electrically coupled to the data line 34a that extends in the X direction of FIG. 1A either directly or through other wire, and the end of the data electrode 34a is coupled to the terminal section provided on the drive circuit 50a. The source electrode 30 and the data line 34a are provided at a lower part of the insulating layer 32. Therefore, the data line 34a extends outward from between the flexible substrate 20 and the insulating layer 32 at the end of the insulating layer 32 on the side adjacent to the drive circuit 50a. This extended portion becomes a terminal to be coupled to the drive circuit 51a.

Semiconductor Device Manufacturing Method

The method for manufacturing the semiconductor device 10 will now be described with reference to FIGS. 2A through 2G. FIGS. 2A through 2G are diagrams showing processes for manufacturing the semiconductor device 10 and are sectional diagrams of an end portion of the semiconductor device 10 shown in FIGS. 1A and 1B.

Figure 2A:
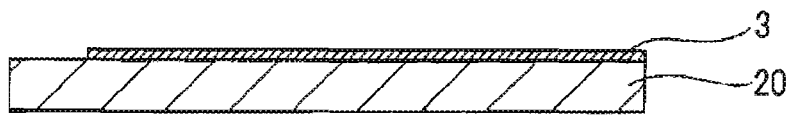
FIG. 2A is a diagram to explain the semiconductor manufacturing method of the first embodiment of the invention.

Referring to FIG. 2A, a metal film pattern 3 as a first layer wiring line is first provided on the flexible substrate 20. The metal film pattern 3 includes conductive wiring lines such as the source/drain electrodes 30, the data line 34a, and the coupling section 55 of the organic TFT 10a as shown in FIG. 11. All the wiring lines arranged directly on the flexible substrate 20 are fabricated together into a pattern.

Note that, a certain portion of the scanning line 34b should not be stacked at the bottom layer but should be stacked on other layers. Therefore, the scanning line 34b should not be formed altogether in this process but should be left as a blank section. In this process, only the coupling section 55 to be coupled with the scanning line 34b is formed.

The metal film pattern 3 may be formed by any method, but a wet phase process is desirable. The wet phase process is a process in which a liquid material is selectively disposed on the flexible substrate 20, dried, and then solidified. The liquid material is a liquid dispersion of conductive particles mixed with a solvent, for example. Examples of the conductive particles are Cr, Al, Ta, Mo, Nd, Cu, Ag, Au, Pd, In, Ni, Co, etc. or alloys containing these metals, and any known metal material or alloys thereof or metal oxides thereof. Also, a commonly known conductive organic material such as poly-ethylene dioxythiophene (PEDOT), metal colloid, or the like may be used. While the main component of the liquid dispersion is water, a liquid containing an alcohol additive may also be used as the dispersion medium.

In the application of droplets, methods such as spin coating, slit coating, dip coating, spray coating, roll coating, curtain coating, printing, and a droplet discharge method can be used. Among them, the droplet discharge method, namely an inkjet method, is preferable. The inkjet method enables formation of the pattern directly on the flexible substrate 20 only at required spots. Accordingly, the inkjet method can simplify the manufacturing process greatly and can provide the film under temperate conditions (at atmospheric pressure).

On the surface (front surface) of the flexible substrate 20, a silicon oxide film ($SiO_2$) or the like may be provided as an insulating base film. In the embodiment, the wiring pattern of only one layer is described, but the wiring pattern may have two or three layers.

In the inkjet method, the liquid material is discharged to predetermined positions on the flexible substrate 20 by operating a moving mechanism for moving an inkjet head (now shown) relative to the flexible substrate 20. The pattern of the discharged liquid material is determined based on electronic data such as bitmap patterns stored in the liquid discharge device. Accordingly, the liquid material can be applied to the desired positions by merely preparing the electronic data. The inkjet head employs a piezoelectric system in which liquid droplets are discharged by changing the volume of an inkjet cavity by use of a piezoelectric element, as well as a thermal system in which the ink is heated inside the ink cavity to generate bubbles of air to discharge the droplets. Of these, the piezoelectric system is preferable since it does not produce a heat effect.

Figure 2B:
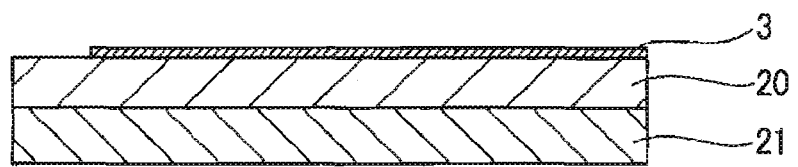
FIG. 2B is a diagram to explain the semiconductor manufacturing method of the first embodiment of the invention.

Referring now to FIG. 2B, a support substrate 21 is attached to a rear surface (second surface) of the flexible substrate 20, that is, a surface on which the metal film pattern 3 is not provided. Accordingly, the flexible substrate 20 can be handled as a rigid substrate in the following manufacturing processes. Also, because the bent and swelling of the flexible substrate 20 is reduced, the alignment precision in each process is improved. This process is extremely useful in the surface-free technology by the laser ablation/annealing (SUFTLA) (registered trademark) as described later when the drive elements are transferred from a temporary substrate to the front surface (first surface) of the flexible substrate in the alignment process, more particularly when the adhesive agent is dropped.

FIGS. 2C through 2F show the process of transferring the drive circuit 50 (representing the drive circuits 50a and 50b) as a drive element to the flexible substrate 20. Although the transfer process uses common techniques, the SUFTLA (registered trademark) in particular is used in this embodiment.

Figure 2C:
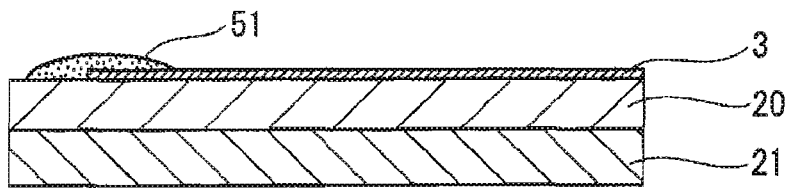
FIG. 2C is a diagram to explain the semiconductor manufacturing method of the first embodiment of the invention.

Referring to FIG. 2C, the adhesive agent 51 is first dropped on the front surface of the flexible substrate 20. This adhesive agent 51 is used to fix the drive circuit 50 to the flexible substrate 20 and may have a function to electrically couple the terminal section 56 of the drive circuit 50 to the coupling section 55 of the metal film pattern 3. That is, the adhesive agent 51 may be anisotropic conductive paste (ACP) containing conductive particles.

At this point, since the support substrate 21 is attached to the rear surface of the flexible substrate 20, the front surface of the flexible substrate 20 is flat and smooth with no bent or swelling. Also, because the support substrate 21 provides the flexible substrate 20 with rigidity, the positioning when applying the adhesive agent 51 can be done accurately and speedily.

Figure 2D:
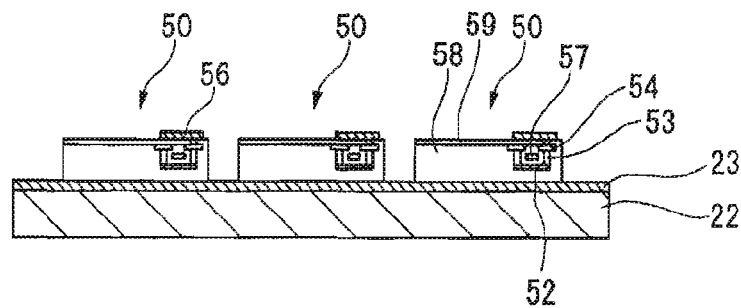
FIG. 2D is a diagram to explain the semiconductor manufacturing method of the first embodiment of the invention.

Separate from the flexible substrate 20, the drive circuit 50 as shown in FIG. 2D is provided above a temporary substrate 22 by a known technology including a high-temperature process. A peeling layer 23 is provided on the temporary substrate 22, and the drive circuit 50 is provided on this peeling layer 23.

The temporary substrate 22 is not a constituting element of the semiconductor device 10 but a member used only in the manufacturing process of the drive circuit 50 as well as in the transfer process for transferring the drive circuit 50 to the flexible substrate 20. Specifically, the temporary substrate 22 is preferably a light-transmitting, heat-resistant glass such as quartz glass capable of withstanding about 1,000° C. Other than the quartz glass, heat-resistant glass such as soda glass, Corning 7059, or Nippon Electric glass OA-2 may be used. The preferred thickness of the temporary substrate 22 is, but not limited to, about 0.1 mm to 0.5 mm, and more preferably 0.5 mm to 1.5 mm. If the temporary substrate 22 is made too thin, the strength thereof decreases, and if it is too thick and the transmittance of the base is low, it causes attenuation of the illuminated light. However, if a highly light-transmitting base material is used, the thickness thereof may exceed the upper limit of above-mentioned thickness.

The peeling layer 23 is composed of a material that experiences peeling inside the layer or at the interface (referred also as intra-layer peeling and/or interfacial peeling) under illuminating light such as laser beams. Specifically, the illumination of light of fixed intensity eliminates or weakens bondage between atoms or molecules making up the constituting substance of the peeling layer 23 to cause ablation or the like and, thereby, induces peeling. When illuminated with light, the components contained in the peeling layer 23 are emanated as gas, leading to separation, or the peeling layer 23 absorbs light and becomes gas, and the vapor thereof is emanated, leading to separation.

The composition of the peeling layer 23 may be amorphous silicon (a-Si). This amorphous silicon may contain hydrogen (H). It is preferable to contain hydrogen, because peeling is enhanced when emanation of hydrogen caused by the light illumination generates internal pressure in the peeling layer 23. The hydrogen content is preferably about 2 at. % or more, more preferably 2 to 20 at. %. The hydrogen content is adjusted, when a chemical vapor deposition (CVD) method is used for example, by appropriately setting the film formation conditions such as gas composition, gas pressure, gas atmosphere, gas flow rate, gas temperature, substrate temperature, and supplied power Examples of other materials of the peeling layer 23 include: silicon oxide or silicon acid compounds, nitride ceramics such as silicon nitride, aluminum nitride, and titanium nitride, organic polymer materials (materials whose atomic bonds are broken by light illumination), metals such as Al, Li, Ti, Mn, In, Sn, Y, La, Ce, Nd, Pr, Gd, or Sm, and alloys containing at lease one thereof.

The peeling layer 23 preferably has a thickness of about 1 nm to 20 μm, more preferably about 10 nm to 2 μm, even more preferably about 20 nm to 1 μm. If the peeling layer 23 is too thin, the thickness of the formed film loses its uniformity, and the peeling becomes uneven. If the layer 23 is too thick, it may become necessary to increase the power (quantity of light) needed for peeling or may require time to remove residue of the layer 23 remained after peeling.

The method for providing the peeling layer 23 may be any method capable of providing the peeling layer 23 with uniform thickness and can be appropriately selected depending on conditions such as the composition and thickness of the peeling layer 23. Examples of suitable methods include: various vapor deposition methods such as CVD including metal organic chemical CVD (MOCCVD), low-pressure CVD, and electron cyclotron resonance CVD (ECR-CVD), deposition, molecular beam (MB) deposition, sputtering, ion doping, and physical vapor deposition (PVD); various plating methods such as electroplating, dip plating (dipping), and electroless plating; coating methods such as Langmuir-Blodgett (LB) method, spin coating, spray coating, and roll coating; various printing methods; transfer method; inkjet method; and powder jet method. Two or more such methods may be used in combination.

Particularly, if the composition of the peeling layer 23 is amorphous silicon (a-Si), it is preferable to form the film by the CVD method such as low-pressure CVD or plasma CVD in particular. Further, if the peeling layer 23 is formed using ceramic by a sol-gel process or if it is composed of an organic polymer material, it is preferable to use the coating method such as the spin coating method in particular.

Each drive circuit 50 is a laminate of a semiconductor layer 52, a gate electrode 57, and source/drain electrodes 54 stacked in this order from the side adjacent the temporary substrate 22. The laminates are isolated by interlayer insulating films 58, and the outermost surface of each of the laminates is covered by a protection layer 59. Also, each terminal section 56 for external connection is a bump which is disposed on the outermost surface of each protection layer 59 and is coupled to the coupling section 55 of the data line 34a or the scanning line 34b with the adhesive agent 51.

The drive circuit 50 is provided on the peeling layer 23. The drive circuit 50 can be manufactured by any known process, such as one described hereunder.

First, an insulating base layer constituting part of the interlayer insulating film 58 is formed above the temporary substrate 22 as a protection layer to protect the peeling layer 23. The insulating base layer may be made of $SiO_2$ and can be formed by a known film formation method such as plasma CVD.

Then, the amorphous silicon film is deposited on the above-described insulating base layer by plasma-enhanced chemical-vapor deposition (PECVD) using $SiH_4$ or by low-pressure chemical-vapor deposition (LPCVD) using $Si_2H_6$. When beamed with laser, amorphous silicon is crystallized and becomes a polycrystalline silicon film which is used as the semiconductor layer 52. After patterning the polycrystalline silicon film, a gate insulating film is formed, and then the gate electrode 57 is formed into film and patterned. Also, an impurity such as phosphorous or boron is implanted in a self-aligning manner in the polycrystalline film by use of the gate electrode to activate the polycrystalline film, thereby forming a source region and a drain region having the structure of a complementary metal oxide semiconductor (CMOS). The interlayer insulating film 58 is formed, and a contact hole 53 is opened, followed by patterning the source electrode 54 and the drain electrode 54. The resultant is further covered by the protection layer 59, and the drive circuit 50 containing the LTPS-TFTs are thereby produced.

Figure 2E:
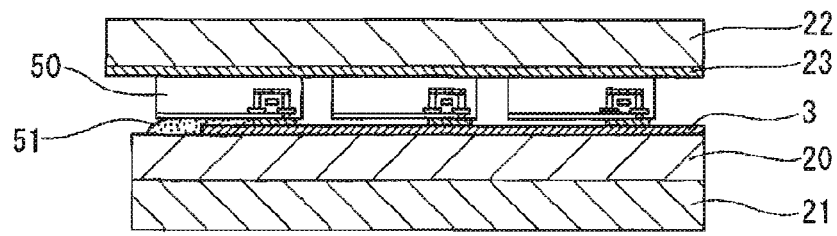
FIG. 2E is a diagram to explain the semiconductor manufacturing method of the first embodiment of the invention.

Referring to FIG. 2E, the temporary substrate 22 and the flexible substrate 20 are arranged in a manner that the temporary substrate 22 is turned upside down so that the terminal section 56 of each drive circuit 50 comes face-to-face with the metal film pattern 3. In the manufacturing method of this embodiment, because the support substrate 21 is attached to the flexible substrate 20, a sufficient pressing force can be applied to the flexible substrate 20 and the temporary substrate 22. Also, even when such a press force is applied, no bent or warpage occurs to the flexible substrate 20. In this case, heat may be applied in order to cure the adhesive agent 51.

Figure 2F:
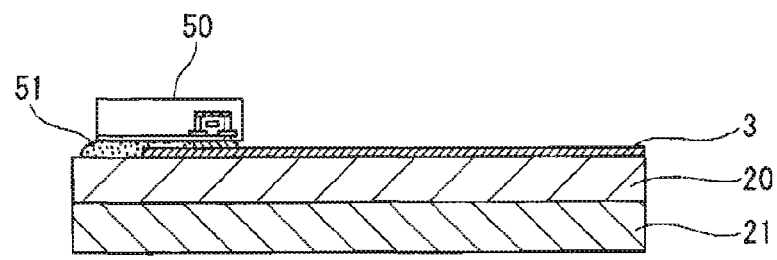
FIG. 2F is a diagram to explain the semiconductor manufacturing method of the first embodiment of the invention.
Figure 2G:
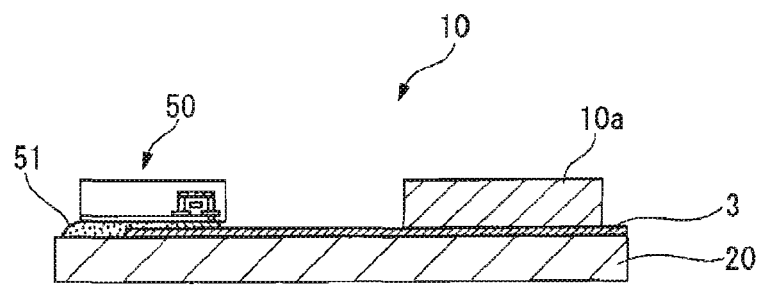
FIG. 2G is a diagram to explain the semiconductor manufacturing method of the first embodiment of the invention.

Then, laser beams are irradiated from the rear surface (not the surface having TFTs) to one surface of the drive circuit 50 that is placed in an area where the adhesive agent 51 is applied. As a result, the bondage between the atoms and molecules of the peeling layer 23 weakens, and hydrogen in the peeling layer 23 becomes molecules that then separate from the crystal bond. Consequently, the bondage between the drive circuit 50 and the temporary substrate 22 completely disappears, thereby enabling easy removal of the drive circuit 50 at the portion irradiated with laser beams. Subsequently, as the temporary substrate 22 is detached from the flexible substrate 20, one drive circuit 50 is transferred from the temporary substrate 22 to a predetermined position on the flexible substrate 20, as shown in FIG. 2F.

The organic TFT 10a is now provided. The organic semiconductor layer 31 is stacked on the source/drain electrodes 30 of the organic TFT 10a that have already been provided on the flexible substrate 20.

Because the organic semiconductor layer 31 is formed by a liquid phase process, it is required to cleanse the surface of the source/drain electrodes 30 on the molecular level as a pretreatment of the liquid phase process. Accordingly, the substrate 20 having the source/drain electrodes 30 formed thereon is cleansed with water, organic solvent, or the like, and then treated with oxygen plasma. The plasma treatment is generally performed by reducing pressure in a chamber by a vacuum pump, and the substrate is exposed to plasma generated by introduction of gases such as oxygen, nitrogen, argon, and/or hydrogen. The plasma treatment may employ atmospheric pressure plasma.

After the oxygen plasma treatment, the organic semiconductor layer 31 is provided by the liquid phase process, typically the inkjet method (droplet discharge method). The material for the organic semiconductor layer 31 may be either a low-molecular organic semiconductor material or a polymer organic semiconductor material.

Examples of the polymer organic semiconductor material include: poly(3-alkylthiophene), poly(3-hexylthiophene) (P3HT), poly(3-octylthiophene), poly(2,5-thienylenevinylene) (PTV), poly(para-phenylenevinylene) (PPV), poly(9,9-dioctylfluorene-cobis-N,N'-(4-methoxyphenyl)-bis-N,N'- phenyl-1, 4-phenylenediamine) (PFMO), poly(9,9-dioctylfluorene-co-benzothiaziazole) (BT), fluorene-triarylamine copolymer, triarylamine series polymer, and fluorene-bithiophene copolymer.

Examples of the low-molecular organic semiconductor material include: carbon 60 (C 60), metal phthalocyanine or the derivatives of the same, acene molecular materials such as anthrancene, tetracene, pentacene, hexacene, etc., and α-oligothiophenes such as quaterthiophene (4T), sexithiophene (6T), octithiophene (8T), dihexylquarterthiophene (DH4T), and dihexylsexithiophene (DH6T).

The above materials can be used singly or as a combination of two or more. However, it is preferable to use a macromolecular organic semiconductor material. An advantage of using the macromolecular organic semiconductor material is that it can be formed into film by a simple process and can be relatively easily oriented. Particularly, fluorine-bithiophene copolymer or polyarylamine is preferable because it is not easily oxidized and is stable in air.

The insulating layer 32 is formed by spin-coating an insulating polymer on the above-formed organic semiconductor layer 31. The material for the insulating layer 32 may be a common gate insulating material of any type. In this case, the material is preferably an organic material such as polyolefin polymer, typically, polyvynil phenole, polyimide, polymethyl methacrylate, polystyrene, polyvinyl alcohol, polyvinyl acetate, or polyisobutylene. The insulating layer 32 can be formed by a wet process such as the spin coat method or the inkjet method.

In order to produce the insulating layer 32 by applying a solvent, it is necessary that the solvent of the solution of the insulating layer 32 does not swell or dissolve the organic semiconductor layer 31 and the substrate 20. A special attention must be paid particularly if the organic semiconductor layer 31 itself is soluble to the solvent. The organic semiconductor layer 31 is a conjugated molecule including an aromatic ring or a conjugated polymer and is thus soluble to an aromatic hydrocarbon. Accordingly, it is preferable to use a non-aromatic hydrocarbon or an organic solvent of ketone series, ether series, or ester series to apply to the insulating layer 32. Also, it is desirable that the insulating layer 32 be non-soluble to the liquid material of the gate electrodes 40 as described hereafter.

The liquid material of the gate electrodes 40 (scanning lines 34b) is now applied as droplets to the insulating layer 32.

The discharge of the liquid material is conducted by the inkjet method. In the inkjet method, much the same way as the formation of the metal film pattern 3, the liquid material is discharged to predetermined positions of the insulating layer 32 by operating the moving mechanism for moving the inkjet head relative to the flexible substrate 20. Also, much the same way as the formation of the metal film pattern 3, the liquid material may be a liquid dispersion of low-resistance conductive metal microparticles mixed with a solvent or may be a water dispersion of polyethylene dioxythiophene (PEDOT) or metal colloid.

The scanning lines 34b are provided simultaneously with the gate electrodes 40. Consequently, the wiring line of each scanning line 34b stretches from each gate electrode 40 of the organic TFT 10a to the coupling section 55 (terminal section 56 of the drive circuit 50) coupled with the drive circuit 50. The scanning line 34b is a wiring line that extends in the Y direction as shown in FIG. 1A. Accordingly, in order to form the scanning line 34b by the inkjet method, the discharge is carried out by scanning the inkjet head and the flexible substrate 20 in a single direction. Therefore, minimum scanning (quantity of movement) is required to form the scanning line 34b.

Then, as the interlayer insulating film (not shown) is provided covering the gate electrode 40 and insulating layer 32 at the top layer, and the support substrate 21 attached to the rear surface of the flexible substrate 20 is peeled off, the semiconductor device 10 of this embodiment is completed. The interlayer insulating film may be composed of the same material as that of the above-described insulating layer 32 and formed using the same wet process (liquid phase process) such as the spin coat method, inkjet method, and the like.

The above embodiment is not limited to the method for manufacturing the organic transistors having the top gate structure but is applicable to a method for manufacturing organic transistors having the bottom gate structure. For the bottom gate structure, the gate electrode is used as a lower electrode, and the source/drain electrodes are formed above this gate electrode with the insulating layer therebetween.

In the manufacturing method of the first embodiment of the invention, because the organic TFT 10a is provided on the flexible substrate 20 after mounting the drive circuit 50 (50a, 50b), the number of steps required for the process of heat-loading the semiconductor layer of the organic TFT 10a is minimized in the series of processes. Particularly, because there are no cleansing and heating processes conducted after the organic semiconductor layer 31 has been formed, the organic semiconductor layer is less likely to deteriorate due to water and heat. Also, because the drive circuit 50 is transferred to the flexible substrate 20 by SUFTLA after having formed the metal film pattern 3, the flexible substrate 20 is not loaded with heat, and, accordingly, the drive circuit having the desired performance can be mounted. As a result, it is possible not only to suppress deformation of the flexible substrate 20 such as thermal expansion and bending caused by heat load but also to reduce the risk of deteriorating the semiconductor layer.

Further, since the support substrate 21 is attached to the flexible substrate 20, the flexible substrate 20 can be handled as a rigid substrate in each manufacturing process. Also, because the bending and swelling of the flexible substrate 20 is reduced because of the support substrate, the positioning in each process is greatly simplified.

Moreover, by using the inkjet method, it becomes possible to fabricate the metal film pattern 3 composed of the data lines 34a, part of the scanning lines 34, pixel electrodes D, and the source/drain electrodes 30 directly on the substrate 20. Also, the pattern 3 can be easily fabricated, as it is not necessary to carry out the process of forming these wires on the entire surface of the substrate or to carry out the process of removing.

As described above, according to the semiconductor manufacturing method of one embodiment of the invention, the semiconductor device can be manufactured at low costs, low temperature, and less energy. In particular, it is suitable to manufacture flexible devices. Also, because the organic TFT occupies only part of the device and because the drive circuit contains the LTPS-TFT with a high field effect transfer rate, the semiconductor device as manufactured in this manner has sufficient drive capacity when applied to various electronic devices. Moreover, the organic TFT of such a semiconductor device has excellent features as it is not exposed to high temperature in the manufacturing process that may cause deterioration to the semiconductor layer.

In this embodiment, although the organic TFT is used as the switching element having the organic semiconductor layer, and the LTPS-TFT is used as the drive circuit, this embodiment of the invention is not limited thereto.

Electrooptical Device

Figure 3:
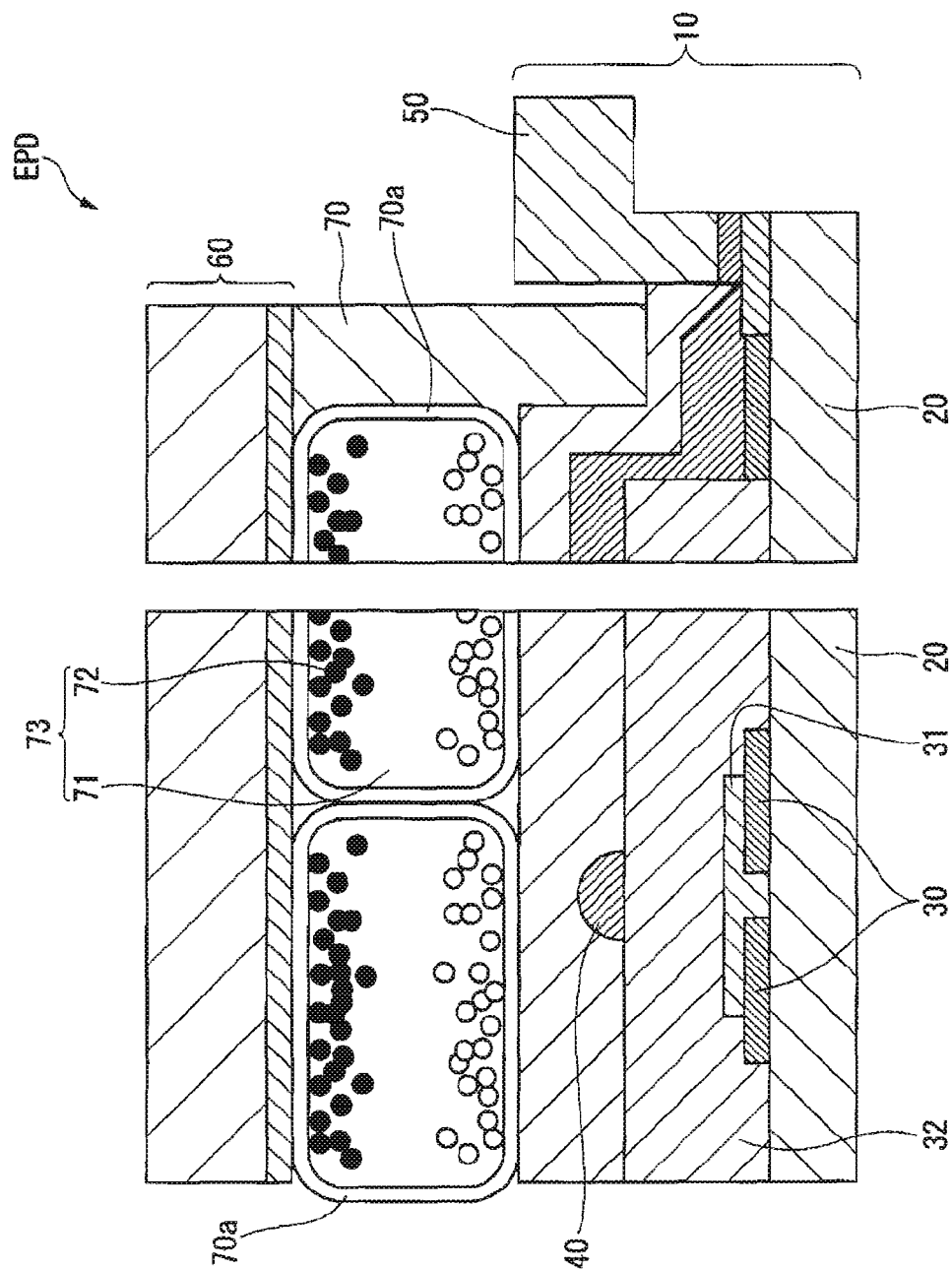
FIG. 3 is a diagram showing one example of an electrooptical device of a second embodiment of the invention.

Referring now to FIG. 3, an electrooptical device corresponding to another embodiment of the invention will be described. In this case, an electrophoretic display using the above-described semiconductor device is described as the electrooptical device. This electrophoretic display EPD includes: the semiconductor device 10 used as a TFT substrate, an opposing substrate 60 placed face-to-face with this semiconductor device 10, and an electrophoretic layer (electrooptical layer) 70 placed between the TFT substrate 10 and the opposing substrate 60.

The electrophoretic layer 70 is equipped with a plurality of microcapsules 70a. The microcapsules 70a are composed of resin film, each of which is substantially as large as one pixel, and are provided to cover the entire display area. Specifically, the microcapsules 70a are disposed close to each other, covering the display area with no space therebetween. Each of the microcapsules 70a contains electrophoretic dispersion liquid 73 having, e.g., a dispersion medium 71 and electrophoretic particles.

The electrophoretic dispersion liquid 73 containing the dispersion medium 71 and the electrophoretic particles 72 is now described in greater detail.

In the electrophoretic dispersion liquid 73, the electrophoretic particles 72 are dispersed in the dispersion medium 71 stained with a dye. Each electrophoretic particle 72 is a substantially spherical microparticle with the diameter of about 0.01 μm to 10 μm. The electrophoretic particle 72 is made of an inorganic oxide or an inorganic hydroxide having a hue (including black and white) different from that of the dispersion medium 71. The electrophoretic particles 72 made of such oxide or hydroxide have an intrinsic surface isoelectric point. The surface charge density (the amount of charge) of the electrophoretic particle 72 varies in proportion to the hydrogen-ion exponent pH of the dispersion medium 71.

The surface isoelectric point here indicates a state where the algebraic sum of charges of the ampholyte in the solution is zero, represented by a hydrogen-ion exponent pH. For example, if the pH of the dispersion medium 71 is equal to the surface isoelectric point of the electrophoretic particles 72, the effective charge of the particles is zero, and therefore, the particles do not respond to an external electric field. If the pH of the dispersion medium 71 is lower than the surface isoelectric point of the particles, the surfaces of the particles are positively charged based on the formula (1) below. In contrast, if the pH of the dispersion medium 71 is higher than the surface isoelectric point of the particles, the surfaces of the particles are negatively charged based on the formula (2) below.

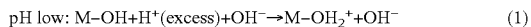

pH low: $M-OH+H^+(excess)+OH^- \rightarrow M-OH_2^+ + OH^-$  (1)

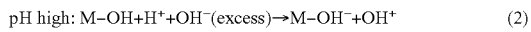

pH high: $M-OH+H^+ +OH^-(excess) \rightarrow M-OH^- + OH^+$  (2)

As the difference between the pH of the dispersion medium 71 and the surface isoelectric point of the particles increases, the amount of charge of the particle increases according to formula (1) or (2). When the difference exceeds a predetermined level, the amount of charge is nearly saturated and neither increases nor decreases even if the pH changes further. Although this level varies depending on the type, size, shape, etc. of the particle, the amount of charge is considered nearly saturated when the difference reaches a value of about 1 or more for any particle.

The electrophoretic particle 72 can be, for example, titanium dioxide, zinc oxide, magnesium oxide, colcothar, aluminum oxide, black lower titanium oxide, chromium oxide, boehmite, FeOOH, silicon dioxide, magnesium hydroxide, nickel hydroxide, zirconium oxide, and copper oxide.

The electrophoretic particle 72 can be used as a plain microparticle, or with its surface modified in various ways. For example, the surface of the particle can be: coated with acrylic resin, epoxy resin, polyester resin, polyurethane resin, and other polymers; coupled with silane, titanate, aluminate, fluorine, and other coupling agents; or graft polymerized with acrylic monomer, styrene monomer, epoxy monomer, isocyanate monomer, and other monomers. The surface of the particle can be modified by one or a combination of two ore more of these processes.

Non-aqueous organic solvents such as hydrocarbon, halogen hydrocarbon, and ether is used as the dispersion medium 71. The dispersion medium 71 can be stained with a dye, such as spirit black, oil yellow, oil blue, oil green, Bali first blue, macrorex blue, oil brown, Sudan black, and first orange. The dispersion medium 71 has a hue different from that of the electrophoretic particle 72.

The electrophoretic display having the above-mentioned structure includes the semiconductor device 10 as the TFT substrate. Therefore, the display can be manufactured at low costs, low temperature, and low energy. Furthermore, it provides a flexible display.

The electrophoretic display using the semiconductor device of the embodiments of the invention can be favorably used in an organic electroluminescence (EL) display and the like.

Electronic Apparatus

The electrophoretic display described above is applicable to various electronic apparatuses having a display. Examples of the electronic apparatus having the electrophoretic display will now be described.

Figure 4:
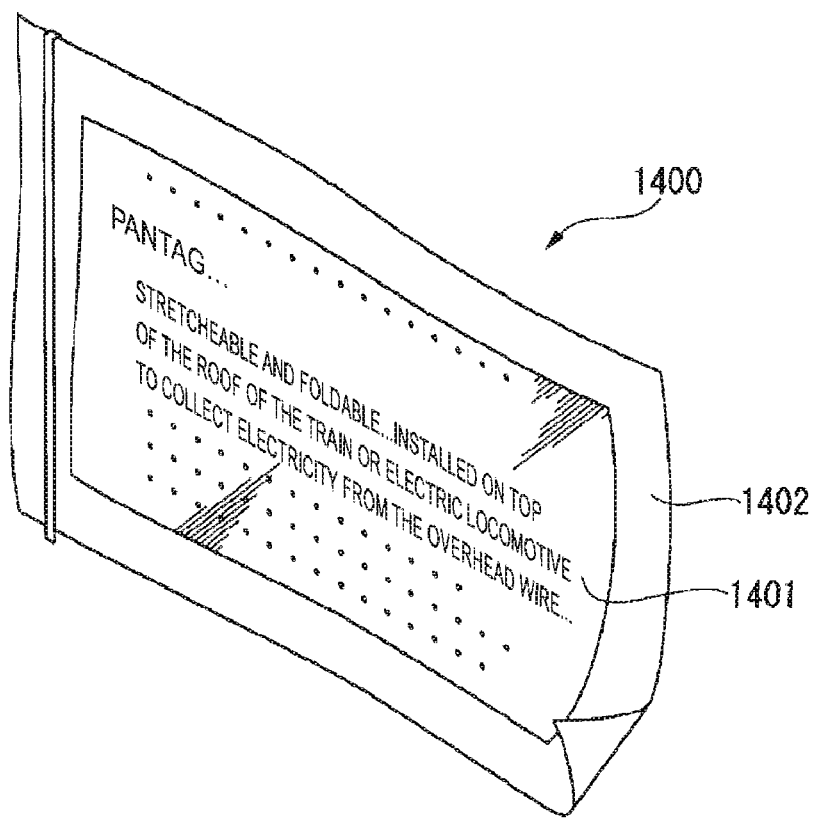
FIG. 4 is a diagram showing an example of an electronic apparatus employing some embodiments of the invention.

First, an example in which the electrophoretic display is applied to flexible electronic paper will be explained. FIG. 4 is a perspective view of the structure of such electronic paper. Electronic paper 1400 is equipped with a display 1401 as the electrophoretic display according the embodiments of the invention. The electronic paper 1400 also has a body 1402 formed of a rewritable sheet having the same texture and flexibility as regular paper.

Figure 5:
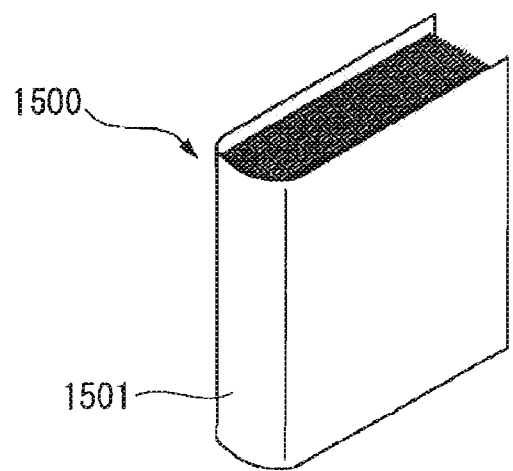
FIG. 5 is a diagram showing an example of an electronic apparatus employing some embodiments of the invention.

FIG. 5 is a perspective view of the structure of an electronic notebook. An electronic notebook 1500 includes a bundle of sheets of the electronic paper 1400 shown in FIG. 4 and a cover 1501 to hold the electronic paper 1400. The cover includes a data input unit (not shown) to input display data sent from an external device, for example. The content displayed on the electronic paper can be changed and renewed, with the electronic paper being bundled, in accordance with the display data.

In addition to the above-mentioned example, examples of other such electronic apparatuses include: liquid crystal televisions, video tape recorders of viewfinder types or monitor viewing types, car navigation systems, pagers, personal digital assistants, electric calculators, word processors, work stations, picture phones, point-of-sale (POS) terminals, and apparatuses equipped with a touch panel. The electrooptical device according to the embodiments of the invention is suitable also for displays of these electronic apparatuses.

The entire disclosure of Japanese Patent Application No. 2006-188269, filed Jul. 7, 2006 is expressly incorporated by reference herein.

What is claimed is:

1. A method for manufacturing a semiconductor device which is equipped with a switching element having an organic semiconductor layer and a drive circuit electrically coupled to the switching element on a first surface of a flexible substrate, the method comprising:

provide the drive circuit above a temporary substrate;

transferring the drive circuit to the first surface of the flexible substrate; and providing the organic semiconductor layer by a liquid phase process after transferring the drive circuit to the first surface of the flexible substrate.

2. The method for manufacturing a semiconductor device according to claim 1, further comprising:

attaching a support substrate to a second surface of the flexible substrate before transferring the drive circuit to the first surface of the flexible substrate.

3. The method for manufacturing a semiconductor device according to claim 1, the liquid phase process being a droplet discharge method.

4. A semiconductor device manufactured by the manufacturing method of claim 1.

5. An electrooptical device equipped with the semiconductor device of claim 4.

* * * * *

UNITED STATES PATENT AND TRADEMARK OFFICE
CERTIFICATE OF CORRECTION

PATENT NO. : 7,737,436 B2  Page 1 of 1
APPLICATION NO. : 11/771346
DATED : June 15, 2010
INVENTOR(S) : Toshiki Hara It is certified that error appears in the above-identified patent and that said Letters Patent is hereby corrected as shown below:

<u>On the Cover Page</u>

Item (75) Inventor:
Change: "Toshihiki Hara, Suwa (JP)" to --Toshiki Hara, Suwa (JP)--

Signed and Sealed this

Fourteenth Day of September, 2010

David J. Kappos
*Director of the United States Patent and Trademark Office*